US011352694B2

(12) United States Patent
Nakahashi et al.

(10) Patent No.: US 11,352,694 B2
(45) Date of Patent: Jun. 7, 2022

(54) DRAWING APPARATUS AND CONTROL METHOD THEREOF

(71) Applicant: NUFLARE TECHNOLOGY, INC., Yokohama (JP)

(72) Inventors: Satoshi Nakahashi, Yokohama (JP); Kaoru Tsuruta, Yokohama (JP)

(73) Assignee: NUFLARE TECHNOLOGY, INC., Yokohama (JP)

( * ) Notice: Subject to any disclaimer, the term of this patent is extended or adjusted under 35 U.S.C. 154(b) by 119 days.

(21) Appl. No.: 16/167,910

(22) Filed: Oct. 23, 2018

(65) Prior Publication Data
US 2019/0127847 A1 May 2, 2019

(30) Foreign Application Priority Data

Oct. 27, 2017 (JP) .............................. JP2017-208463

(51) Int. Cl.
*H01J 37/32* (2006.01)
*C23C 16/44* (2006.01)
(Continued)

(52) U.S. Cl.
CPC ........ *C23C 16/4405* (2013.01); *H01J 37/026* (2013.01); *H01J 37/20* (2013.01);
(Continued)

(58) Field of Classification Search
CPC . C23C 16/4405; H01J 37/026; H01J 37/3174; H01J 37/20; H01J 37/32816;
(Continued)

(56) References Cited

U.S. PATENT DOCUMENTS 5,312,519 A * 5/1994 Sakai ................... B08B 7/0035
134/1
5,466,942 A * 11/1995 Sakai ................... B08B 7/0035
250/492.2
(Continued)

FOREIGN PATENT DOCUMENTS

JP       2-172152       7/1990
JP       2001-44108     2/2001
(Continued)

OTHER PUBLICATIONS

Japanese Office Action dated Mar. 5, 2021 in Japanese Application No. 2017-208463, with English Machine Translation, 6 pgs.

*Primary Examiner* — Duy Vu N Deo
*Assistant Examiner* — Christopher Remavege
(74) *Attorney, Agent, or Firm* — Oblon, McClelland, Maier & Neustadt, L.L.P.

(57) ABSTRACT

A drawing apparatus includes: a drawing part; a cleaning-gas generator; a first valve between the cleaning-gas generator and the drawing part and adjusting a supply amount of gas to the drawing part; a first pressure gauge measuring a pressure in the drawing part; a compensation-gas introducing part introducing compensation-gas to be supplied between the cleaning-gas generator and the first valve; a second valve between the compensation-gas introducing part and the first valve and adjusting a supply amount of the compensation-gas; and a valve controller controlling the first and second valves, wherein the valve controller controls the first valve to supply the cleaning-gas at a predetermined flow rate to the drawing part and controls the second valve to cause a pressure in the drawing part to be a predetermined pressure when the first pressure gauge detects a pressure reduction due to a reduction in a supply flow rate of the cleaning-gas.

4 Claims, 3 Drawing Sheets

(51) Int. Cl.
*H01J 37/317* (2006.01)
*H01J 37/20* (2006.01)
*H01J 37/21* (2006.01)
*H01J 37/02* (2006.01)

(52) U.S. Cl.
CPC .......... *H01J 37/21* (2013.01); *H01J 37/3174* (2013.01); *H01J 37/32816* (2013.01); *H01J 37/32862* (2013.01); *H01J 2237/006* (2013.01); *H01J 2237/022* (2013.01); *H01J 2237/31776* (2013.01)

(58) Field of Classification Search
CPC ................ H01J 37/32862; H01J 37/21; H01J 2237/31776; H01J 2237/022; H01J 2237/006
See application file for complete search history.

(56) References Cited

U.S. PATENT DOCUMENTS

| | | | | |
|---|---|---|---|---|
| 5,539,211 | A * | 7/1996 | Ohtoshi | B08B 7/0035 134/1.1 |
| 5,949,076 | A * | 9/1999 | Ohtoshi | H01J 37/02 250/396 R |
| 5,981,960 | A * | 11/1999 | Ooaeh | G03F 7/70925 250/492.2 |
| 6,394,109 | B1 * | 5/2002 | Somekh | B82Y 10/00 134/39 |
| 6,667,475 | B1 * | 12/2003 | Parran | H01J 37/18 134/1.1 |
| 7,323,399 | B2 * | 1/2008 | Demos | C23C 16/26 257/E21.242 |
| 7,695,763 | B2 * | 4/2010 | Ishizuka | B08B 7/0035 427/248.1 |
| 8,092,641 | B1 * | 1/2012 | Xiao | H01J 37/28 156/345.37 |
| 8,507,879 | B2 * | 8/2013 | Vane | H01J 37/02 250/492.1 |
| 9,401,261 | B2 * | 7/2016 | Taneda | H01J 37/147 |
| 9,881,768 | B2 * | 1/2018 | Kawai | H01J 37/185 |
| 10,814,361 | B2 * | 10/2020 | Borschel | B08B 7/04 |
| 2004/0159638 | A1 * | 8/2004 | Demos | C23C 16/26 219/121.35 |
| 2011/0079711 | A1 * | 4/2011 | Buehler | H01J 37/28 250/307 |

FOREIGN PATENT DOCUMENTS

| | | |
|---|---|---|
| JP | 2005-76061 | 3/2005 |
| JP | 2008-198895 | 8/2008 |
| JP | 2015-153763 | 8/2015 |
| JP | 2016-25128 | 2/2016 |

* cited by examiner

DRAWING APPARATUS AND CONTROL METHOD THEREOF

CROSS REFERENCE TO RELATED APPLICATIONS

This application is based upon and claims the benefit of priority from the prior Japanese Patent Application No. 2017-208463, filed on Oct. 27, 2017, the entire contents of which are incorporated herein by reference.

FIELD

The embodiments of the present invention relate to a drawing apparatus and control method thereof.

BACKGROUND

A charged-particle-beam drawing apparatus using a charged particle beam such as an electron beam is employed to manufacture a mask or a template for transferring a fine circuit pattern onto a wafer. It is known that fluctuations of an electron beam, such as changes in the irradiation position of the electron beam, occur and deteriorate a drawn pattern when drawing is performed by an electron-beam drawing apparatus. Deviation of the irradiation position of an electron beam is referred to as "beam drift". One of generation causes of the beam drift is, for example, a phenomenon as described below.

For example, even an electron-beam drawing apparatus that is substantially vacuumized to form an electron beam contains a minute amount of hydrocarbon ($C_nH_m$)-based gas. Components, resists, and the like in the apparatus are generation sources of this type of gas and it is difficult to completely eliminate the gas. An irradiated electron beam (or diffused electrons thereof) reacts with the gas described above and contamination is formed on the surfaces of components of an electron optical system, such as a deflector in the electron-beam drawing apparatus. If charges are accumulated on the contamination, an electric field is generated due to a difference in the quantity of accumulated charges and the irradiated electron beam is deflected by the electric field. As a result, the irradiation position of the electron beam fluctuates.

To solve this problem of the irradiation position deviation, a method of cleaning an inner part of an electron-beam drawing apparatus using gas (hereinafter, "cleaning gas") that contains ozone ($O_3$) or radicals is known as a method to reduce contamination in the apparatus. In this method, cleaning gas is introduced into an electron-beam drawing apparatus and ozone or radicals is caused to react with contamination and change the contamination to volatile gas, thereby eliminating the gas.

However, fluctuations in the pressure of the cleaning gas in the apparatus cause defocusing of the electron optical system although introduction of the cleaning gas can suppress contamination in the apparatus. The pressure in the apparatus during drawing is normally controlled to be substantially constant. However, it is likely that the pressure in the apparatus cannot be maintained, for example, when a cleaning gas generator detects an abnormality and stops supply of the cleaning gas. In this case, defocusing of the electron optical system occurs during drawing and drawing accuracy of a mask is deteriorated.

To solve this problem, controlling or correcting an irradiation amount of an electron beam or focusing thereof based on the pressure in the apparatus is considered. However, it is not easy to control an electron beam based on the pressure in the apparatus and it is practically difficult to install such a function in the apparatus.

Accordingly, embodiments provide a drawing apparatus and a control method thereof that overcome the problems described above and that can maintain the pressure in the apparatus within a predetermined range to easily suppress deterioration of drawing accuracy.

SUMMARY

A drawing apparatus according to a present embodiment includes: a drawing part configured to irradiate a charged particle beam to a processing target and draw a predetermined pattern on the processing target; a cleaning gas generator configured to generate cleaning gas to be supplied to the drawing part; a first valve provided between the cleaning gas generator and the drawing part and configured to adjust a supply amount of gas to the drawing part; a first pressure gauge configured to measure a pressure in the drawing part; a compensation-gas introducing part configured to introduce compensation gas to be supplied between the cleaning gas generator and the first valve; a second valve provided between the compensation-gas introducing part and the first valve and configured to adjust a supply amount of the compensation gas; and a valve controller configured to control the first and second valves, wherein the valve controller controls the first valve to supply the cleaning gas at a predetermined flow rate to the drawing part and controls the second valve to cause a pressure in the drawing part to be a predetermined pressure when the first pressure gauge detects a pressure reduction due to a reduction in a supply flow rate of the cleaning gas.

The cleaning gas may be ozone gas, and the compensation-gas may be inert gas or oxygen gas.

The apparatus may further includes a flowmeter configured to measure a flow rate of the cleaning gas supplied from the cleaning gas generator or a second pressure gauge configured to measure a pressure in the cleaning gas generator, wherein the valve controller controls the second valve to supply the compensation gas at least any of when a pressure in the drawing part becomes equal to or lower than a threshold, when the cleaning gas generator stops generation of the cleaning gas, and when a reduction in a flow rate of the cleaning gas supplied from the cleaning gas generator or a reduction in a pressure in the cleaning gas generator is detected.

The apparatus may further includes a flowmeter configured to detect flow rate fluctuations of the cleaning gas supplied from the cleaning gas generator or a second pressure gauge configured to detect a pressure in the cleaning gas generator, wherein the valve controller controls the second valve to stop supply of the compensation gas at least either when the cleaning gas generator resumes generation of the cleaning gas or when a flow rate of the cleaning gas supplied from the cleaning gas generator or a pressure in the cleaning gas generator exceeds a threshold.

A control method of a drawing apparatus according to an embodiment, the drawing apparatus including a drawing part configured to irradiate a charged particle beam to a processing target and draw a predetermined pattern on the processing target, a cleaning gas generator configured to generate cleaning gas to be supplied to the drawing part, a first valve configured to adjust a supply amount of gas to the drawing part, a compensation-gas introducing part configured to introduce compensation gas to be supplied between the cleaning gas generator and the first valve, a second valve configured to adjust a supply amount of the compensation gas, and a valve controller configured to control the first and second valves, the method includes: controlling the first valve to supply the cleaning gas at a predetermined flow rate to the drawing part; and supplying compensation gas to cause a pressure in the drawing part to be a predetermined pressure when a reduction in a supply amount of the cleaning gas or a reduction in a pressure in the drawing part is detected.

DETAILED DESCRIPTION

Figure 1:
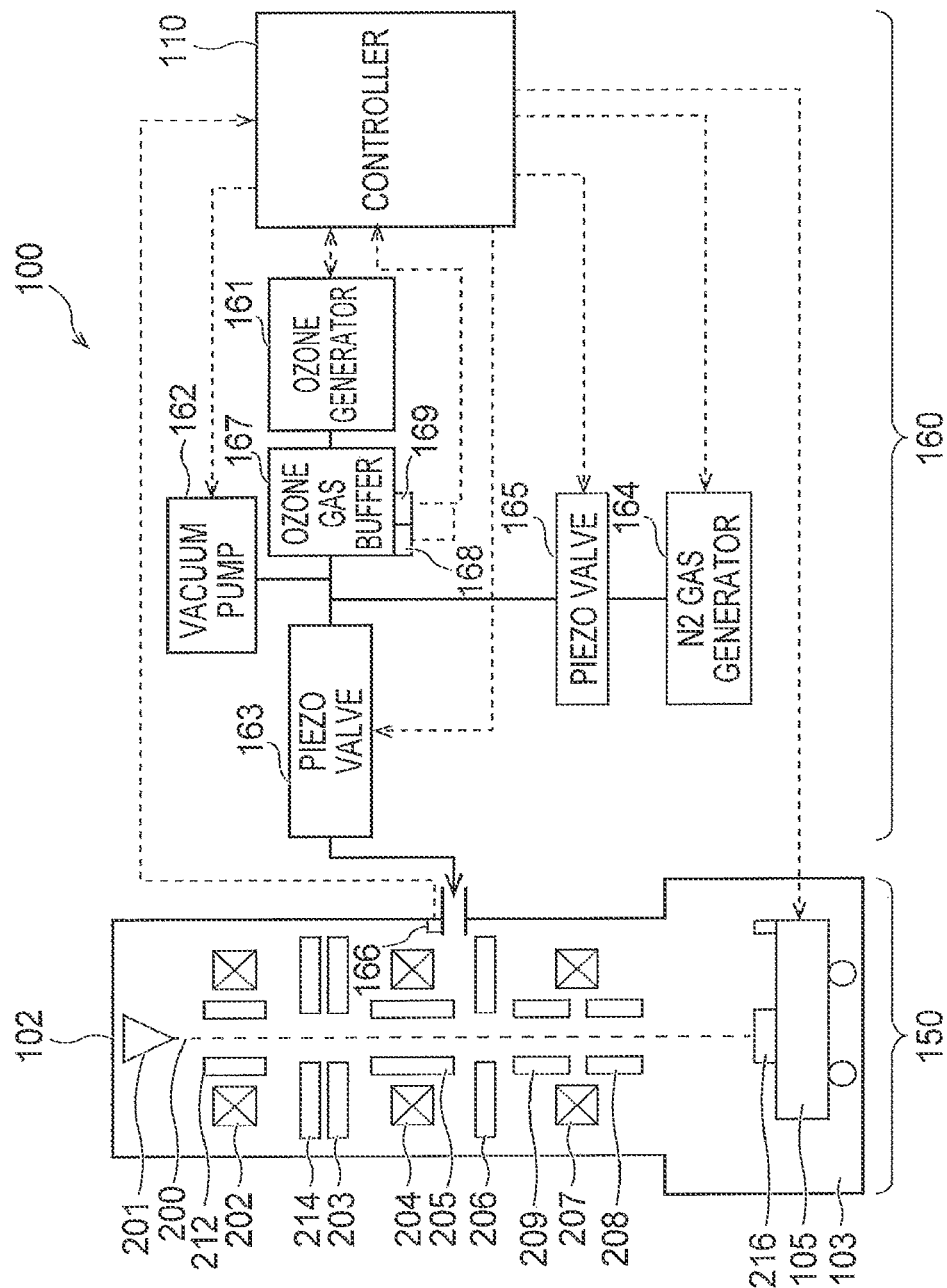
FIG. 1 illustrates a configuration of an electron-beam drawing apparatus according to a first embodiment.

Embodiments will now be explained with reference to the accompanying drawings. The present invention is not limited to the embodiments. The drawings are schematic or conceptual, and the ratios and the like among respective parts are not necessarily the same as those of actual products. In the present specification and the drawings, elements identical to those described in the foregoing drawings are denoted by like reference characters and detailed explanations thereof are omitted as appropriate.

In the embodiments described below, a configuration of an electron-beam drawing apparatus including a charged particle gun is explained as an example of a drawing apparatus. However, the beam is not limited to an electron beam and a beam using other charged particles such as an ion beam can be used.

FIG. 1 illustrates a configuration of an electron-beam drawing apparatus according to a first embodiment. In FIG. 1, an electron-beam drawing apparatus (hereinafter, "drawing apparatus") 100 is an example of a variable-shaped electron-beam drawing apparatus and includes a drawing part 150 and a control operation part 160.

The drawing part 150 includes an electron column 102 and a drawing chamber 103.

The electron column 102 can keep the inner part thereof at a substantially vacuum atmosphere and an electron gun 201, an illumination lens 202, a blanking deflector 212, a blanking aperture 214, shaping apertures 203 and 206, a projection lens 204, a shaping deflector 205, an objective lens 207, deflectors 208 and 209, and the like are arranged in the electron column 102.

The illumination lens 202, the projection lens 204, and the objective lens 207 are all electromagnetic lenses that change excitation to cause an electron beam to converge and adjust an imaging position (an irradiation position). These lenses are arrayed in an axis direction of an electron beam 200 from one end on the upstream side where the electron gun 201 is arranged to the downstream side where a stage 105 explained later is arranged as illustrated in FIG. 1.

The illumination lens 202 illuminates the shaping aperture 203 with the electron beam 200 emitted from the electron gun 201. The electron beam 200 shaped by the shaping aperture 203 is further projected by the projection lens 204 on the shaping aperture 206. The position of a shaping aperture image on the shaping aperture 206 is controlled by the shaping deflector 205. The shape and dimension of the electron beam 200 are thus changed. The electron beam 200 having transmitted through the shaping aperture 206 is subjected to irradiation position alignment by the objective lens 207 and is thereafter deflected by the deflectors 208 and 209. The irradiation position of the electron beam 200 is corrected by the deflector 208 and is thereafter irradiated to a specimen 216 placed in the drawing chamber 103.

The stage 105 is arranged in the drawing chamber 103. The stage 105 is driven in an X direction, a Y direction, and a Z direction by a controller 110 served as a valve controller. The specimen (mask) 216 being a processing target is placed on the stage 105. The mask 216 can be, for example, a mask substrate such as quartz having a light shielding film, such as a chrome (Cr) film or a molybdenum-silicon (MoSi) film formed thereon and further having a resist film formed on the light shielding film. A predetermined pattern is drawn on the resist film by the electron beam 200. The mask 216 can be, for example, a mask blanks on which no pattern is formed.

The control operation part 160 includes the controller 110, an ozone generator 161, a vacuum pump 162, a first piezo valve 163, a nitrogen gas supplier 164, a second piezo valve 165, a pressure gauge 166, an ozone gas buffer 167, a pressure gauge 168, and a flowmeter 169. In FIG. 1, solid lines indicate flows or pipes of gas and broken lines indicate flows of signals.

The controller 110 receives information of pressures and a flow rate from the pressure gauges 166 and 168 and the flowmeter 169 and controls the respective constituent elements in the drawing part 150 and the control operation part 160 based on the received information.

The ozone generator 161 serving as a cleaning gas generator generates ozone to be supplied into the electron column 102. The ozone generator 161 can generate highly-pure ozone at a high gas pressure and, for example, generates highly-pure ozone gas at a gas pressure of about 1000 Pascals. The ozone generator 161 is connected to the electron column 102 via the ozone gas buffer 167 and the first piezo valve 163 through pipe connection.

The ozone generator 161 has a pressure gauge and a flowmeter (171 and 172, respectively, in FIG. 2) therein and monitors the pressure of ozone gas therein and the supply amount thereof. The ozone generator 161 has a function to automatically stop generation of ozone gas when the ozone gas pressure therein or the supply amount reaches an abnormal value (an upper threshold). Generally, ozone gas is active gas and is dangerous when leaking to outside. Therefore, considering the safety, the ozone generator 161 is configured to automatically stop the generation of ozone gas when an abnormality occurs.

The first piezo valve 163 is provided on a pipe between the ozone generator 161 and the electron column 102. The first piezo valve 163 is a valve that is driven by a piezo actuator and adjusts the supply amount (the flow rate) of ozone gas to be introduced from the ozone generator 161 into the electron column 102 under control of the controller 110.

The vacuum pump 162 is, for example, a diffusion pump. The pipe extending from the ozone generator 161 to the first piezo valve 163 branches in the middle and a pipe branching off therefrom is connected to the vacuum pump 162. The vacuum pump 162 discharges a part of the ozone gas generated by the ozone generator 161, which has been restricted by the first piezo valve 163 and has not been introduced into the electron column 102.

The nitrogen gas supplier 164 serving as a compensation gas supplier is connected to the pipe between the ozone generator 161 and the first piezo valve 163 via the second piezo valve 165 and is connected to the electron column 102 via the second piezo valve 165 and the first piezo valve 163 through pipe connection. The nitrogen gas supplier 164 is used also for purging the drawing apparatus 100. The nitrogen gas supplier 164 is, for example, a pipe that is provided in plant facilities to generate nitrogen gas from liquid nitrogen or the like and supplies nitrogen gas. In the present embodiment, nitrogen gas being inert gas is used as compensation gas. However, the compensation gas can be inert gas other than nitrogen or can be oxygen ($O_2$) gas.

The second piezo valve 165 is provided on a pipe between the nitrogen gas supplier 164 and the first piezo valve 163 and adjusts the supply amount of nitrogen gas. The second piezo valve 165 is a valve driven by a piezo actuator. The second piezo valve 165 adjusts the supply amount (the flow rate) of nitrogen gas to be introduced to the pipe between the ozone generator 161 or the ozone gas buffer 167 and the first piezo valve 163 under control of the controller 110.

The pressure gauge 166 serving as a first pressure gauge is provided in the electron column 102 to measure (detect) the pressure in the electron column 102. The pressure gauge 166 is connected to be communicable with the controller 110 and outputs a measurement value of the pressure to the controller 110.

The ozone gas buffer 167 is provided between the ozone generator 161 and the first piezo valve 163 and temporarily retains ozone gas therein. The ozone gas buffer 167 is provided to stably supply ozone gas to the first piezo valve 163. The ozone gas buffer 167 can be regarded as a part of the cleaning gas generator as well as the ozone generator 161.

The pressure gauge (second pressure gauge) 168 is provided in the ozone gas buffer 167 and measures the pressure of cleaning gas in the ozone gas buffer 167. The pressure gauge 168 is connected to be communicable with the controller 110 and transmits a measurement value of the pressure to the controller 110. The pressure gauge 168 can be provided on a pipe between the ozone generator 161 and the ozone gas buffer 167. In this case, the pressure gauge 168 measures the pressure in the pipe and transmits a measurement value thereof to the controller 110.

The flowmeter 169 is provided in the ozone gas buffer 167 and measures the flow rate of the cleaning gas in the ozone gas buffer 167. The flowmeter 169 is connected to be communicable with the controller 110 and transmits a measurement value of the flow rate to the controller 110. The flowmeter 169 can be provided on the pipe between the ozone generator 161 and the ozone gas buffer 167. In this case, the flowmeter 169 measures the flow rate of gas flowing through the pipe and transmits a measurement value thereof to the controller 110.

Figure 2:
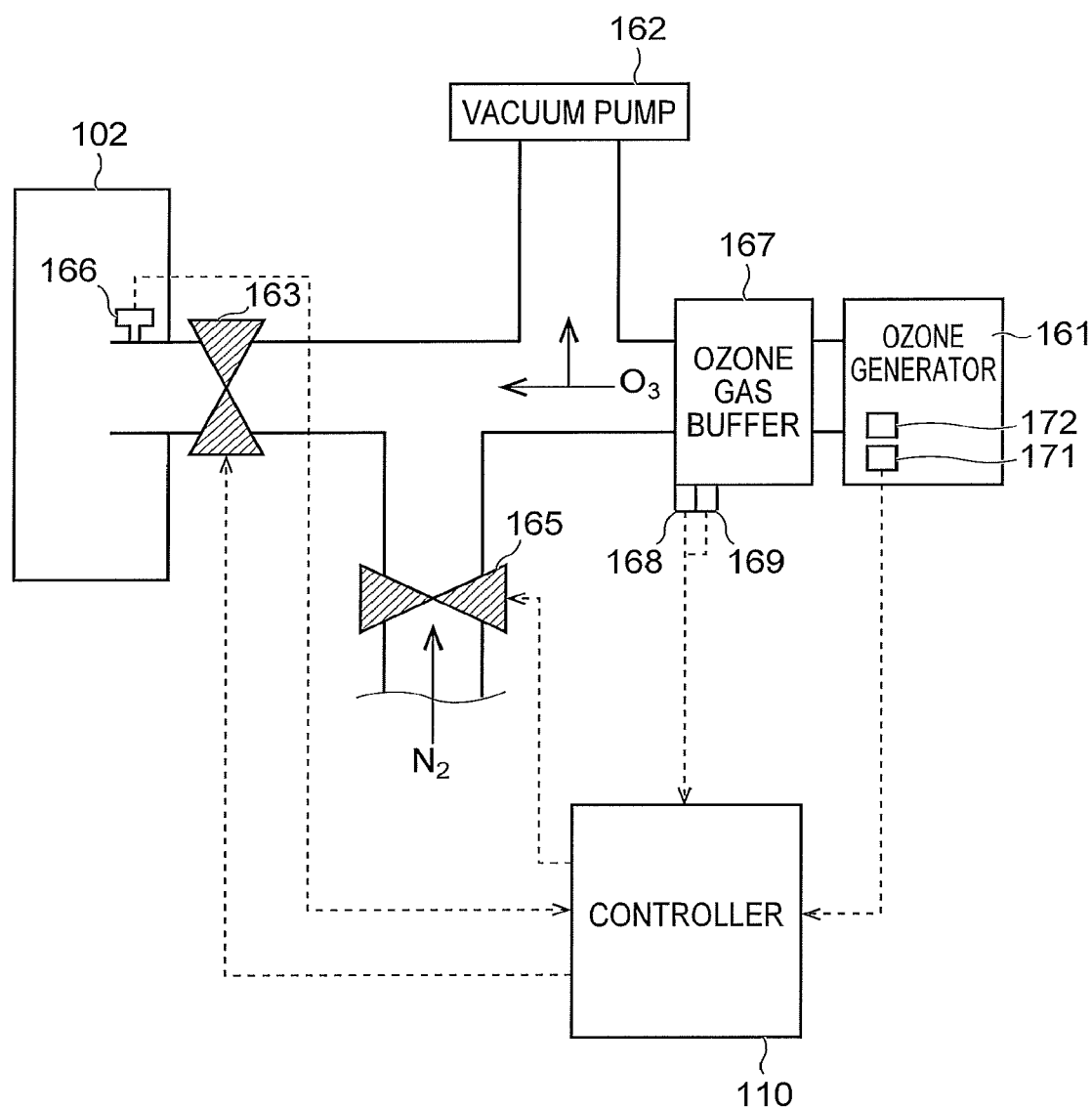
FIG. 2 illustrates a configuration from the ozone generator to the electron column in more detail.

FIG. 2 illustrates a configuration from the ozone generator to the electron column in more detail. Functions of the first and second piezo valves 163 and 165, and the like are explained with reference to FIG. 2.

The pressure gauge 166 measures the pressure in the electron column 102 and transmits a measurement value of the pressure to the controller 110. The controller 110 executes feedback control of the first piezo valve 163 based on the pressure measurement value from the pressure gauge 166. The first piezo valve 163 adjusts the introduction amount of ozone gas to cause the pressure in the electron column 102 to fall within a predetermined range preferable for forming the electron beam 200, for example, a range between $10^{-4}$ Pascals and $10^{-5}$ Pascals. That is, the first piezo valve 163 introduces a part (a small amount) of the ozone gas supplied from the ozone generator 161 into the electron column 102 to maintain the pressure in the electron column 102 within the predetermined range. Due to this adjustment of the introduction amount of ozone gas, the pressure in the electron column 102 can be maintained within the predetermined range. By introducing the ozone gas into the electron column 102, it is possible to cause the ozone gas to react with contamination and reduce the contamination in the electron column 102. For example, the ozone gas in the electron column 102 and the electron beam 200 are caused to collide with each other to separate the ozone gas into oxygen and active oxygen. Contamination adhering on the mask or the surfaces of the respective components in the apparatus is caused to react with the separated active oxygen and is evaporated as, for example, carbon monoxide gas, carbon dioxide, water, and the like. Accordingly, the contamination in the electron column 102 can be eliminated without exposing the electron column 102 to the atmosphere.

It is preferable that the ozone generator 161 introduce undeteriorated highly-pure ozone gas into the electron column 102 by generating ozone gas and causing the ozone gas to flow. For this purpose, the vacuum pump 162 discharges excess ozone gas that has been restricted by the first piezo valve 163. As a result, the ozone generator 161, the first piezo valve 163, and the vacuum pump 162 can maintain the generation state of ozone gas and can supply a predetermined flow rate of ozone gas to the electron column 102.

Meanwhile, the ozone generator 161 has the pressure gauge 171 and the flowmeter 172. The pressure gauge 171 measures the pressure of ozone gas generated in the ozone generator 161. The flowmeter 172 measures the flow rate of ozone gas to be supplied from the ozone generator 161 to the ozone gas buffer 167. The ozone generator 161 monitors the internal pressure and the flow rate of ozone gas using the pressure gauge 171 and the flowmeter 172, and automatically stops generation of ozone gas when the pressure or the flow rate reaches an abnormal value (an upper threshold).

When supply of ozone gas from the ozone generator 161 is stopped, the pressure of ozone gas in the pipe lowers and the ozone gas is not sufficiently supplied into the electron column 102 even when the first piezo valve 163 is adjusted. Therefore, it becomes difficult to maintain the pressure in the electron column 102 within the predetermined range. If the pressure in the electron column 102 greatly lowers and falls outside the predetermined range, defocusing of the electron optical system in the electron column 102 occurs, which deteriorates the drawing accuracy of the mask as described above.

Accordingly, in the present embodiment, the controller 110 opens the second piezo valve 165 to supply nitrogen gas to the pipe between the first piezo vale 163 and the ozone gas buffer 167 when supply of ozone gas is not sufficient to maintain the pressure in the electron column 102 within the predetermined range. That is, the second piezo valve 165 supplies nitrogen gas instead of ozone gas to increase the pressure of gas in the pipe. For example, when a pressure value measured by the pressure gauge 168 falls below a lower limit (a threshold) of the predetermined range, the controller 110 opens the second piezo valve 165 to supply nitrogen gas. Accordingly, nitrogen gas is supplied to the pipe and the pressure of gas in the pipe increases. This enables the controller 110 to maintain the pressure of gas in the electron column 102 within the predetermined range by adjusting the first piezo valve 163.

At this time, mixture gas including ozone gas and nitrogen gas is supplied into the electron column 102. However, focusing of the electron optical system depends more greatly on the gas pressure in the electron column 102 than the gas species supplied into the electron column 102. Therefore, when the pressure of gas in the electron column 102 is maintained by compensation of nitrogen gas as in the present embodiment, defocusing of the electron optical system during drawing can be suppressed.

Further, nitrogen gas added as compensation gas is relatively safer gas than active gas such as ozone gas. Therefore, the pressure of gas in the electron column 102 can be maintained while the safety of the drawing apparatus 100 is kept. The compensation gas can be other inert gas or oxygen gas instead of nitrogen gas.

When the ozone generator 161 recovers and resumes generation of ozone gas, compensation of nitrogen gas becomes unnecessary and thus the controller 110 closes the second piezo valve 165 to stop supply of nitrogen gas. Resume of generation of ozone gas can be known based on a state signal indicating execution/stop of a generation operation of ozone gas in the ozone generator 161, the pressure of ozone gas generated in the ozone generator 161, or the flow rate of ozone gas supplied from the ozone generator 161 to the ozone gas buffer 167.

Therefore, the controller 110 can receive the state signal indicating execution/stop of the generation operation of ozone gas in the ozone generator 161 and can close the second piezo valve 165 to stop supply of nitrogen gas when the state signal switches from "stop" to "execution". Alternatively, the controller 110 can receive the pressure value from the pressure gauge 171 and can close the second piezo valve 165 to stop supply of nitrogen gas when the pressure of ozone gas in the ozone generator 161 exceeds a threshold. Further, the controller 110 can alternatively receive the flow rate value from the flowmeter 172 and can close the second piezo valve 165 to stop supply of nitrogen gas when the flow rate of ozone gas supplied from the ozone generator 161 exceeds a threshold.

In this way, when the ozone generator 161 is capable of supplying a sufficient amount of ozone gas, the controller 110 closes the second piezo valve 165 and supplies ozone gas from the first piezo valve 163 to the electron column 102. This enables contamination in the electron column 102 to be eliminated as efficiently as possible while maintaining the pressure in the electron column 102.

A control method of the drawing apparatus 100 according to the present embodiment is explained next.

Figure 3:
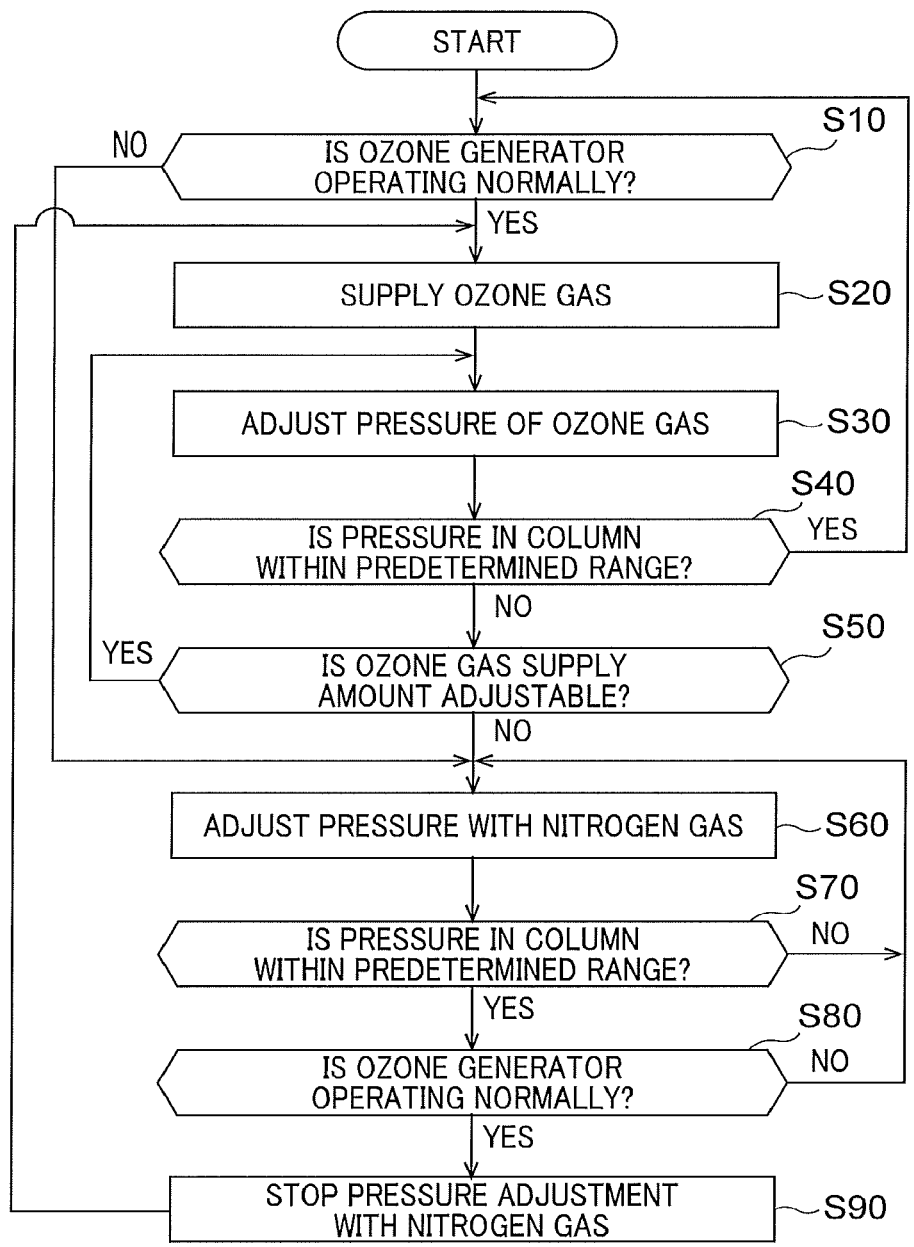
FIG. 3 is a flowchart illustrating an example of the control method of the drawing apparatus according to the present embodiment.

FIG. 3 is a flowchart illustrating an example of the control method of the drawing apparatus according to the present embodiment. In the present embodiment, first, when the ozone generator 161 is driven normally and a state signal from the ozone generator 161 indicates an execution state (YES at Step S10), ozone gas is introduced into the electron column 102 (Step S20). At this time, the ozone generator 161, the vacuum pump 162, and the first piezo valve 163 are driven and ozone gas is introduced into the electron column 102. The controller 110 acquires the pressure in the electron column 102 from the pressure gauge 166 and adjusts the pressure of ozone gas in the electron column 102 (Step S30).

When a pressure value from the pressure gauge 166 is within a predetermined range (YES at Step S40), the drawing apparatus 100 continues the processes at Steps S10 to S30. That is, the controller 110 controls the first piezo valve 163 based on the pressure value from the pressure gauge 166 to continuously control the pressure in the electron column 102. At this time, the controller 110 keeps the second piezo valve 165 closed.

While the pressure in the electron column 102 is kept within the predetermined range, the electron gun 201 irradiates the electron beam 200 toward the mask 216 on the stage 105. Accordingly, a pattern is drawn on the mask 216. The processes at Steps S10 to S40 are performed repeatedly.

On the other hand, when the pressure value from the pressure gauge 166 is not within the predetermined range (NO at Step S40), the controller 110 determines whether the supply amount of ozone gas is further adjustable by the first piezo valve 163 (Step S50). When the supply amount of ozone gas is further adjustable by the first piezo valve 163 (YES at Step S50), the process returns to Step S30 and the controller 110 adjusts the pressure in the electron column 102 with ozone gas.

When the ozone generator 161 is not driving normally and the state signal from the ozone generator 161 does not indicate an execution state at Step S10 (NO at Step S10) or when the supply amount of ozone gas cannot be adjusted any more (NO at Step S50), the controller 110 opens the second piezo valve 165 to supply (compensate) nitrogen gas to the pipe between the first piezo valve 163 and the ozone gas buffer 167 and adjust the pressure in the electron column 102 with nitrogen gas (Step S60). Accordingly, nitrogen gas instead of ozone gas or in addition to ozone gas is supplied into the electron column 102. When the pressure value from the pressure gauge 166 is still outside the predetermined range (NO at Step S70), the controller 110 adjusts the second piezo valve 165 to increase the supply amount of nitrogen gas and adjust the pressure in the electron column 102. At this time, the first piezo valve 163 is also controlled along with the second piezo valve 165 to adjust the pressure in the electron column 102.

When the pressure value from the pressure gauge 166 falls within the predetermined range (YES at Step S70), the controller 110 executes feedback control of the first piezo valve 163 based on the pressure value from the pressure gauge 166 to keep the pressure in the electron column 102 within the predetermined range while supplying nitrogen gas into the electron column 102 until the ozone generator 161 drives normally (NO at Step S80). This enables the controller 110 to keep the pressure in the electron column 102 within the predetermined range. At this time, the controller 110 can keep the pressure in the electron column 102 within the predetermined range by executing feedback control of the second piezo valve 163 based on the pressure value from the pressure gauge 166 in the same manner as that at Steps S10 to S40. That is, although the controller 110 adjusts the second piezo valve 165 to supply nitrogen gas, control of other constituent elements can be identical to control in a normal operation. Because this enables the pressure in the electron column 102 to be kept within the predetermined range, defocusing of the electron optical system during drawing can be suppressed.

The processes at Steps S60 to S80 are performed until the ozone generator 161 recovers (NO at Step S80).

When the ozone generator 161 recovers and the state signal from the ozone generator 161 indicates an execution state (YES at Step S80), the controller 110 closes the second piezo valve 165 to stop supply of nitrogen gas (Step S90). At this time, the controller 110 controls the first and second piezo valves 163 and 165 in response to the pressure value from the pressure gauge 166 to prevent the pressure in the electron column 102 from falling outside the predetermined range. Therefore, the controller 110 gradually closes the second piezo valve 165 while adjusting supply of ozone gas so as to prevent the pressure in the electron column 102 from falling outside the predetermined range due to stop of supply of nitrogen gas. After stop of supply of nitrogen gas, the process returns to Step S20 and the controller 110 adjusts the pressure in the electron column 102 with ozone (Steps S20 to S40).

As described above, determination as to whether the ozone generator 161 has recovered can be performed using the pressure value from the pressure gauge (second pressure gauge) 171 or the flow rate value from the flowmeter 172 instead of the state signal described above. In this case, the controller 110 can control the second piezo valve 165 to stop supply of nitrogen gas when the pressure value from the pressure gauge 171 exceeds a threshold. Alternatively, the controller 110 can control the second piezo valve 165 to stop supply of nitrogen gas when the flow rate value from the flowmeter 172 exceeds a threshold.

The determination as to whether the ozone generator 161 has recovered can alternatively be performed using a combination of any two or more of the state signal, the pressure value from the pressure gauge 171, and the flow rate value from the flowmeter 172. In this case, the controller 110 can determine recovery of the ozone generator 161 more accurately.

As described above, the drawing apparatus 100 according to the present embodiment includes the second piezo valve 165 that supplies nitrogen gas to the pipe from the ozone generator 161 to the first piezo valve 163, in addition to the first piezo valve 163 that adjusts the gas supply amount to the electron column 102. When the pressure in the electron column 102 lowers and the pressure cannot be maintained within a predetermined range only with supply of ozone gas, the controller 110 controls the second piezo valve 165 to supply nitrogen gas. Accordingly, even when the ozone generator 161 detects an abnormality and stops generation of ozone gas, the controller 110 can maintain the pressure of gas in the electron column 102 within the predetermined range by supplying nitrogen gas from the second piezo valve 165. At this time, it suffices that the controller 110 executes feedback control of the pressure of gas in the electron column 102 using the pressure gauge 166 and the first piezo valve 163 in the same manner as that in a normal operation.

Controlling the supply amount of gas based on the pressure in the electron column 102 in this way is easier than controlling or correcting the irradiation amount of an electron beam or focusing thereof. Therefore, the drawing apparatus according to the present embodiment can easily suppress deterioration of the drawing accuracy while keeping the pressure in the electron column 102 within a predetermined range.

When the ozone generator 161 recovers, the controller 110 controls the second piezo valve 165 to stop supply of nitrogen gas based on the state signal from the ozone generator 161, the pressure value from the pressure gauge 171, or the flow rate value from the flowmeter 172. This enables the controller 110 to appropriately stop supply of nitrogen gas after the ozone generator 161 recovers.

First Modification

In the embodiment described above, the controller 110 determines recovery of the ozone generator 161 using the state signal from the ozone generator 161, the pressure value from the pressure gauge 171, or the flow rate value from the flowmeter 172. In a first modification, in contrast thereto, the controller 110 determines recovery of the ozone generator 161 using a pressure value in the ozone gas buffer 167 or a flow rate of ozone gas supplied from the ozone gas buffer 167.

For example, the ozone gas buffer 167 includes the pressure gauge 168 and the flowmeter 169. The pressure gauge 168 measures the pressure in the ozone gas buffer 167. The flowmeter 169 measures the flow rate of ozone gas supplied from the ozone gas buffer 167.

At Step S60 in FIG. 3, the controller 110 can determine that the ozone generator 161 has resumed generation of ozone when the pressure in the ozone gas buffer 167 exceeds a threshold. Alternatively, the controller 110 can determine that the ozone generator 161 has resumed generation of ozone when the flow rate of ozone gas supplied from the ozone gas buffer 167 exceeds a threshold. Even with this control, the effects of the present embodiment are not lost.

Second Modification

In the embodiment described above, the controller 110 opens the second piezo valve 165 to supply nitrogen gas when the pressure value measured by the pressure gauge 168 falls below the threshold of the predetermined range. In a second modification, in contrast thereto, the controller 110 starts supply of nitrogen gas using a state signal from the ozone generator 161, a pressure value from the pressure gauge 171, or a flow rate value from the flowmeter 172.

For example, at Step S60 in FIG. 3, the controller 110 can open the second piezo valve 165 to supply nitrogen gas when the state signal from the ozone generator 161 switches from "execution" to "stop". Alternatively, the controller 110 can open the second piezo valve 165 to supply nitrogen gas when the pressure value from the pressure gauge 171 falls below a threshold. Further, the controller 110 can alternatively open the second piezo valve 165 to supply nitrogen gas when the flow rate value from the flowmeter 172 falls below a threshold.

In this way, the controller 110 can determine an abnormality in the ozone generator 161 based on a state signal from the ozone generator 161, a pressure value from the pressure gauge 171, or a flow rate value from the flowmeter 172 instead of a pressure value from the pressure gauge 166, and can start supply of nitrogen gas.

Further, in the second modification, the controller 110 can alternatively determine an abnormality in the ozone generator 161 using a pressure value in the ozone gas buffer 167 or a flow rate of ozone gas supplied from the ozone gas buffer 167 instead of the state signal from the ozone generator 161, the pressure value from the pressure gauge 171, or the flow rate value from the flowmeter 172. It is not always necessary to measure the absolute value of the flow rate or the pressure and a relative value or a variation value thereof can be measured instead. In addition, it is not always necessary to measure the value and only needs to detect variations.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A control method of a drawing apparatus comprising a drawing part that irradiates a charged particle beam to a processing target and draws a predetermined pattern on the processing target, a cleaning gas generator that generates cleaning gas to be supplied to the drawing part, a first valve that adjusts a supply amount of gas to the drawing part, a compensation gas introducing part that introduces a compensation gas to be supplied between the cleaning gas generator and the first valve, a second valve that adjusts a supply amount of the compensation gas, and a valve controller that controls the first and second valves, the method comprising:
- controlling the first valve to supply the cleaning gas at a predetermined flow rate to the drawing part;
- detecting a pressure inside the drawing part;
- detecting a flow rate of the cleaning gas; and
- supplying compensation gas that causes a pressure inside the drawing part to be at a predetermined pressure, when a reduction in a supply amount of the cleaning gas from the cleaning gas generator or a reduction in a pressure in the drawing part is detected, wherein
- the cleaning gas is ozone gas, and
- the compensation gas is an inert gas or an oxygen gas.

2. The method of claim 1, wherein
the valve controller controls the second valve to supply the compensation gas at least any of when a pressure in the drawing part becomes equal to or lower than a threshold, when the cleaning gas generator stops generation of the cleaning gas, and when a reduction in a flow rate of the cleaning gas supplied from the cleaning gas generator or a reduction in a pressure in the cleaning gas generator is detected.

3. The method of claim 1, wherein
the valve controller controls the second valve to stop supply of the compensation gas at least either when the cleaning gas generator resumes generation of the cleaning gas or when a flow rate of the cleaning gas supplied from the cleaning gas generator or a pressure in the cleaning gas generator exceeds a threshold.

4. The method of claim 2, wherein
the valve controller controls the second valve to stop supply of the compensation gas at least either when the cleaning gas generator resumes generation of the cleaning gas or when a flow rate of the cleaning gas supplied from the cleaning gas generator or a pressure in the cleaning gas generator exceeds a threshold.

* * * * *